(12) United States Patent
Lehtola et al.

(10) Patent No.: US 10,243,517 B2
(45) Date of Patent: Mar. 26, 2019

(54) ENHANCED AMPLIFIER EFFICIENCY THROUGH CASCODE CURRENT STEERING

(71) Applicant: SKYWORKS SOLUTIONS, INC., Woburn, MA (US)

(72) Inventors: Philip John Lehtola, Cedar Rapids, IA (US); David Steven Ripley, Marion, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/900,709

(22) Filed: Feb. 20, 2018

(65) Prior Publication Data

US 2018/0183389 A1   Jun. 28, 2018

Related U.S. Application Data

(63) Continuation of application No. 15/042,349, filed on Feb. 12, 2016, now Pat. No. 9,899,961.

(60) Provisional application No. 62/116,464, filed on Feb. 15, 2015.

(51) Int. Cl.
| | |
|---|---|
| *H03F 1/02* | (2006.01) |
| *H03F 3/21* | (2006.01) |
| *H03F 3/19* | (2006.01) |
| *H03F 1/22* | (2006.01) |
| *H03F 3/24* | (2006.01) |
| *H03F 3/72* | (2006.01) |

(52) U.S. Cl.
CPC ............ *H03F 1/0288* (2013.01); *H03F 1/22* (2013.01); *H03F 3/19* (2013.01); *H03F 3/211* (2013.01); *H03F 3/245* (2013.01); *H03F 3/72* (2013.01); *H03F 2200/111* (2013.01); *H03F 2200/451* (2013.01); *H03F 2200/555* (2013.01); *H03F 2203/7209* (2013.01)

(58) Field of Classification Search
CPC ...................................................... H03F 1/0288
USPC ...................................... 330/295, 124 R, 311
See application file for complete search history.

(56) References Cited

U.S. PATENT DOCUMENTS

| | | | | |
|---|---|---|---|---|
| 4,586,004 A | * | 4/1986 | Valdez ................... | H03F 1/223 326/110 |
| 4,663,599 A | * | 5/1987 | Patch ........................ | H03F 3/19 330/307 |
| 6,937,667 B1 | * | 8/2005 | Fullerton ............. | H04B 1/7095 375/256 |
| 7,205,846 B1 | * | 4/2007 | Ding ....................... | H03F 3/189 330/295 |
| 9,667,200 B2 | * | 5/2017 | Ripley ...................... | H03F 1/22 |
| 9,929,698 B2 | * | 3/2018 | Gudem ............... | H01L 27/0255 |
| 2005/0134385 A1 | * | 6/2005 | Costa ........................ | H03F 1/22 330/283 |

(Continued)

*Primary Examiner* — Patricia T Nguyen
(74) *Attorney, Agent, or Firm* — Chang & Hale LLP

(57) ABSTRACT

According to some implementations, a power amplifier (PA) includes a common emitter configured to receive a radio-frequency (RF) signal. The PA also includes a carrier amplifier coupled to the common emitter to form a carrier cascode configuration, a collector of the carrier amplifier provided with a first supply voltage. The PA further includes a peaking amplifier coupled to the common emitter to form a peaking cascode configuration, a collector of the peaking amplifier provided with a second supply voltage greater than the first supply voltage.

20 Claims, 10 Drawing Sheets

(56) References Cited

U.S. PATENT DOCUMENTS

| | | | |
|---|---|---|---|
| 2009/0212870 A1* | 8/2009 | Chen | H03F 1/0288 |
| | | | 330/295 |
| 2009/0238308 A1* | 9/2009 | Weiner | H03D 3/007 |
| | | | 375/334 |
| 2010/0148877 A1* | 6/2010 | Oakley | H03F 1/0288 |
| | | | 330/295 |
| 2011/0121912 A1* | 5/2011 | Kim | H03F 1/0288 |
| | | | 333/124 |
| 2013/0027272 A1* | 1/2013 | Karthaus | H01Q 1/246 |
| | | | 343/850 |
| 2014/0268447 A1* | 9/2014 | Gudem | H01L 27/0255 |
| | | | 361/56 |
| 2016/0036393 A1* | 2/2016 | Lin | H03F 1/32 |
| | | | 330/295 |
| 2016/0241209 A1* | 8/2016 | Lehtola | H03F 3/211 |
| 2017/0149393 A1* | 5/2017 | Mizokami | H03F 1/565 |

* cited by examiner

ENHANCED AMPLIFIER EFFICIENCY
THROUGH CASCODE CURRENT STEERING

CROSS-REFERENCE TO RELATED
APPLICATION(S)

This application is a continuation of U.S. Non-provisional application Ser. No. 15/042,349 filed Feb. 12, 2016, entitled ENHANCED AMPLIFIER EFFICIENCY THROUGH CASCODE CURRENT STEERING, which claims priority to U.S. Provisional Application No. 62/116,464 filed Feb. 15, 2015, entitled ENHANCED AMPLIFIER EFFICIENCY THROUGH CASCODE CURRENT STEERING, the disclosure of each of which is hereby expressly incorporated by reference herein in its entirety.

BACKGROUND

Field

The present disclosure relates to power amplifiers in radio-frequency (RF) applications.

Description of the Related Art

Power amplifiers (PAs) are widely used in networks in order to set the transmission power level of an information-bearing signal. For example, PAs are used to set the pulse emission energy of lasers in optical networks. PAs are also included in various wireless network devices—such as base stations and mobile devices—in order to set the transmission power level of a radio-frequency (RF) signal. PAs are also used in local area networks in order to enable wired and wireless connectivity of various devices.

Managing PA operation is important in a mobile device that uses a battery, because the power consumption of the PA often has a substantial impact on battery life. However, satisfying power consumption goals can be detrimental to other goals, such as linearity, which affects signal integrity and error control in data packets.

Some devices, such as wireless devices, utilize a Doherty amplifier to improve PA efficiency. In most circumstances, the Doherty amplifier has efficiency advantages over traditional single ended amplifiers.

Some advanced modulation schemes with high peak to average ratios require the amplifier to be operated several dB from their maximum saturated output power ($P_{sat}$) to maintain linearity. Since a Doherty amplifier has an efficiency peak approximately 6 dB from $P_{sat}$, its linear efficiency can be improved. Furthermore, the Doherty amplifier adds complexity to the PA due to an RF input splitter/phase shifter and an output combiner.

SUMMARY

In accordance with a number of implementations, the present disclosure relates to a power amplifier (PA) including a common emitter configured to receive a radio-frequency (RF) signal. The PA also includes a carrier amplifier coupled to the common emitter to form a carrier cascode configuration, a collector of the carrier amplifier provided with a first supply voltage. The PA further includes a peaking amplifier coupled to the common emitter to form a peaking cascode configuration, a collector of the peaking amplifier provided with a second supply voltage greater than the first supply voltage.

In some implementations, each of the carrier and peaking amplifiers is provided with a bias voltage to allow the respective amplifier to be turned on and off.

In some implementations, the carrier amplifier is turned on by having its bias voltage set to a high level and the peaking amplifier is turned off by having its bias voltage set to a ground level, when an output power (Pout) of the PA is less than a selected value. In some implementations, substantially all of a collector current of the PA is obtained from the first supply voltage to yield a maximum or increased efficiency at the output power.

In some implementations, the carrier amplifier is turned off by having its bias voltage set to the ground level and the peaking amplifier is turned on by having its bias voltage set to the high level, when Pout is greater than the selected value. In some implementations, substantially all of the collector current of the PA is obtained from the second supply voltage to yield an increase in maximum output power.

In some implementations, the selected value is saturation power level (Psat) minus 3 dB.

In some implementations, the carrier cascode configuration and the peaking cascode configuration substantially preserve the gain of the PA in either configuration.

In some implementations, the PA has minimized or reduced discontinuity in an amplitude-to-amplitude (AM-AM) response during a transition between the first and second supply voltages.

In some implementations, the present disclosure relates to a radio-frequency (RF) module that includes a packaging substrate configured to receive a plurality of components. The RF module further includes a power amplifier (PA) implemented on the packaging substrate, the PA including a common emitter configured to receive an RF signal, the PA further including a carrier amplifier coupled to the common emitter to form a carrier cascode configuration, a collector of the carrier amplifier provided with a first supply voltage, the PA further including a peaking amplifier coupled to the common emitter to form a peaking cascode configuration, a collector of the peaking amplifier provided with a second supply voltage greater than the first supply voltage.

In some implementations, the RF module is a front-end module (FEM). In accordance with some implementations, the PA of the RF module includes the functions and/or features of any of the PAs and/or amplification systems described herein.

According to some teachings, the present disclosure relates to a radio-frequency (RF) device that includes a transceiver generate to an RF signal. The RF device also includes a front-end module (FEM) in communication with the transceiver, the FEM including a packaging substrate configured to receive a plurality of components, the FEM further including a power amplifier (PA) implemented on the packaging substrate, the PA including a common emitter configured to receive an RF signal, the PA further including a carrier amplifier coupled to the common emitter to form a carrier cascode configuration, a collector of the carrier amplifier provided with a first supply voltage, the PA further including a peaking amplifier coupled to the common emitter to form a peaking cascode configuration, a collector of the peaking amplifier provided with a second supply voltage greater than the first supply voltage. The RF device further includes an antenna in communication with the FEM, the antenna configured to transmit the amplified RF signal.

In some implementations, the RF device includes a wireless device. In some implementations, the wireless device includes at least one of a base station, a repeater, a cellular phone, a smartphone, a computer, a laptop, a tablet computer, and a peripheral device. In accordance with some implementations, the PA of the FEM module includes the functions and/or features of any of the PAs and/or amplification systems described herein.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

Figure 1:
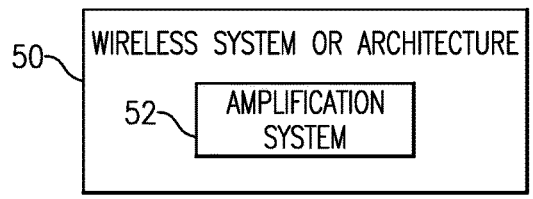
FIG. 1 is a block diagram of a wireless system or architecture according to some implementations.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION OF SOME IMPLEMENTATIONS

The headings provided herein, if any, are for convenience only and do not necessarily affect the scope or meaning of the claimed invention.

Referring to FIG. 1, one or more features of the present disclosure generally relate to a wireless system or architecture 50 having an amplification system 52. In some embodiments, the amplification system 52 can be implemented as one or more devices, and such device(s) can be utilized in the wireless system/architecture 50. In some embodiments, the wireless system/architecture 50 can be implemented in, for example, a portable wireless device. Examples of such a wireless device are described herein.

Figure 2:
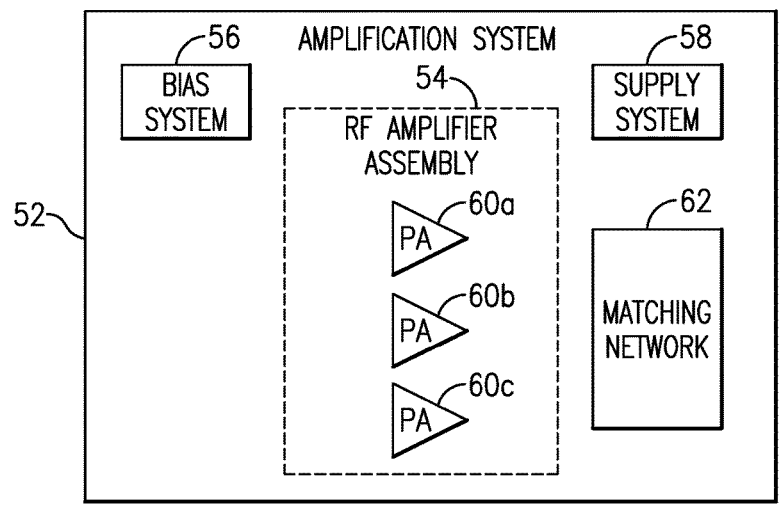
FIG. 2 is a block diagram of an amplification system according to some implementations.

FIG. 2 shows that the amplification system 52 of FIG. 1 typically includes a radio-frequency (RF) amplifier assembly 54 having one or more power amplifiers (PAs). In the example of FIG. 2, three PAs 60a-60c are depicted as forming the RF amplifier assembly 54. It will be understood that other numbers of PA(s) can also be implemented. It will also be understood that one or more features of the present disclosure can also be implemented in RF amplifier assemblies having other types of RF amplifiers.

In some embodiments, the RF amplifier assembly 54 can be implemented on one or more semiconductor die, and such die can be included in a packaged module such as a power amplifier module (PAM) or a front-end module (FEM). Such a packaged module is typically mounted on a circuit board associated with, for example, a portable wireless device.

The PAs (e.g., 60a-60c) in the amplification system 52 are typically biased by a bias system 56. Further, supply voltages for the PAs are typically provided by a supply system 58. In some embodiments, either or both of the bias system 56 and the supply system 58 can be included in the foregoing packaged module having the RF amplifier assembly 54.

In some embodiments, the amplification system 52 can include a matching network 62. Such a matching network can be configured to provide input matching and/or output matching functionalities for the RF amplifier assembly 54.

For the purpose of description, it will be understood that each of the PAs 60a-60c in FIG. 2 can be implemented in a number of ways. FIGS. 3A-3E show non-limiting examples of how each of the PAs 60a-60c in FIG. 2 can be configured.

Figures 3A, 3B, 3C:
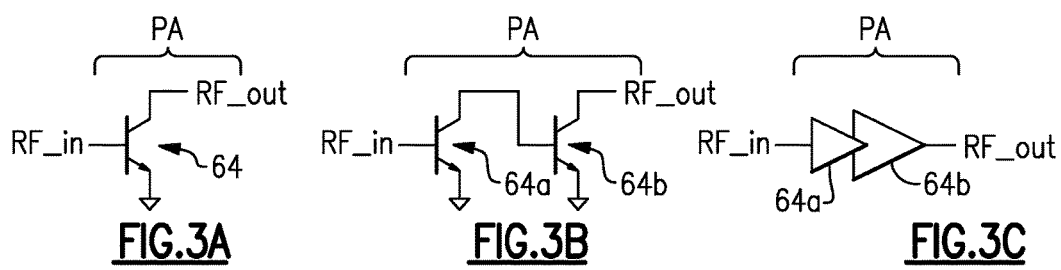
FIGS. 3A-3E show schematic diagrams of power amplifiers according to some implementations.

FIG. 3A shows an example PA having an amplifying transistor 64, where an input RF signal (RF_in) is provided to a base of the transistor 64, and an amplified RF signal (RF_out) is output through a collector of the transistor 64.

FIG. 3B shows an example PA having a plurality of amplifying transistors (e.g., 64a, 64b) arranged in stages. An input RF signal (RF_in) is provided to a base of the first transistor 64a, and an amplified RF signal from the first transistor 64a is output through its collector. The amplified RF signal from the first transistor 64a is provided to a base of the second transistor 64b, and an amplified RF signal from the second transistor 64b is output through its collector to thereby yield an output RF signal (RF_out) of the PA.

In some embodiments, the foregoing example PA configuration of FIG. 3B can be depicted as two or more stages as shown in FIG. 3C. The first stage 64a can be configured as, for example, a driver stage; and the second stage 64b can be configured as, for example, an output stage.

Figures 3D, 3E:
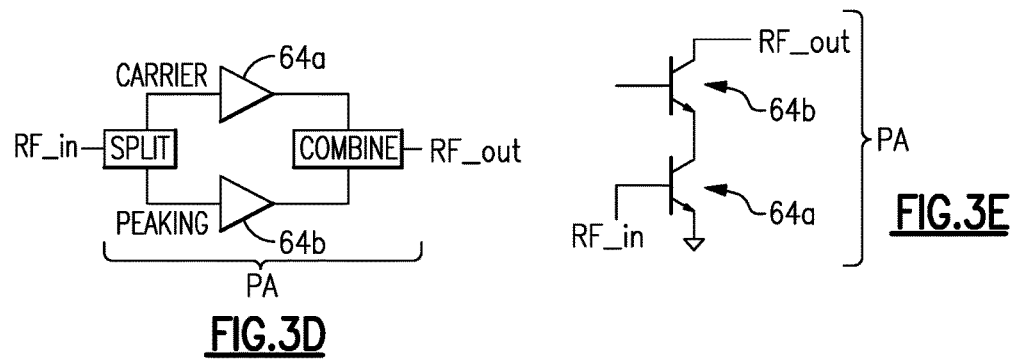

FIG. 3D shows that, in some embodiments, a PA can be configured as a Doherty PA. Such a Doherty PA can include amplifying transistors 64a, 64b configured to provide carrier amplification and peaking amplification of an input RF signal (RF_in) to yield an amplified output RF signal (RF_out). The input RF signal can be split into the carrier portion and the peaking portion by a splitter. The amplified carrier and peaking signals can be combined to yield the output RF signal by a combiner.

FIG. 3E shows that, in some embodiments, a PA can be implemented in a cascode configuration. An input RF signal (RF_in) can be provided to a base of the first amplifying transistor 64a operated as a common emitter device. The output of the first amplifying transistor 64a can be provided through its collector and be provided to an emitter of the second amplifying transistor 64b operated as a common base device. The output of the second amplifying transistor 64b can be provided through its collector so as to yield an amplified output RF signal (RF_out) of the PA.

In the various examples of FIGS. 3A-3E, the amplifying transistors are described as bipolar junction transistors (BJTs) such as heterojunction bipolar transistors (HBTs). It will be understood that one or more features of the present disclosure can also be implemented in or with other types of transistors such as field-effect transistors (FETs).

Figure 4:
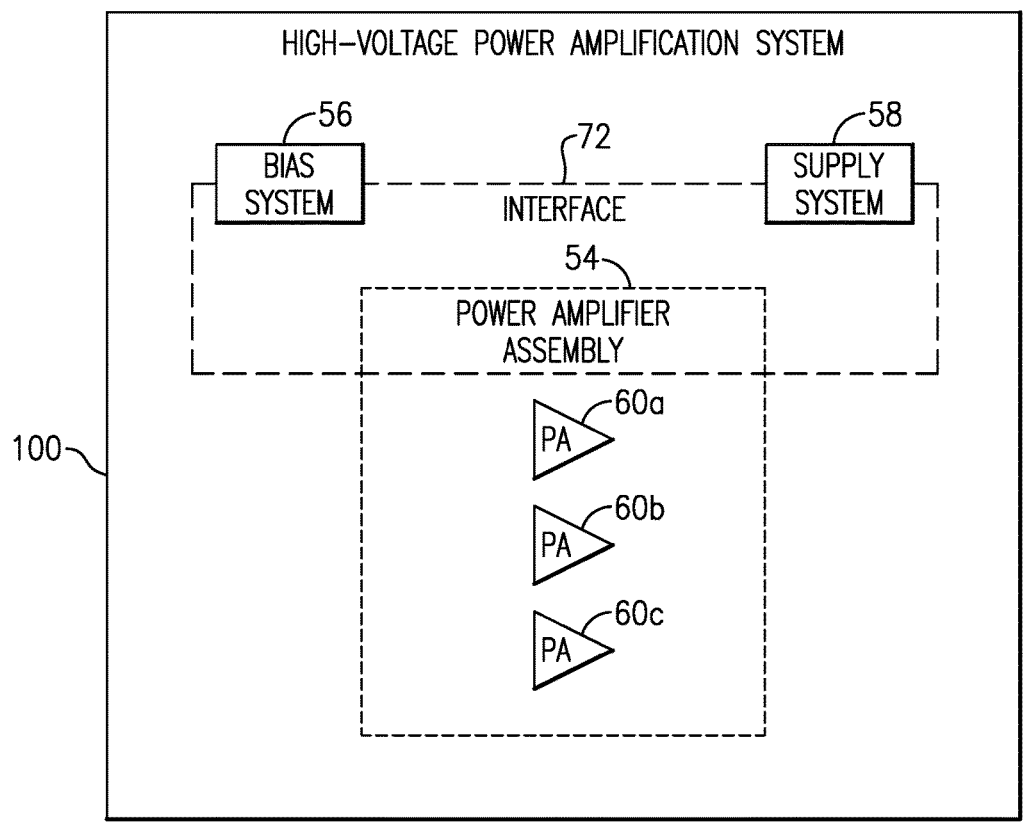
FIG. 4 is a block diagram of an amplification system according to some implementations.

FIG. 4 shows that in some embodiments, the amplification system 52 of FIG. 2 can be implemented as a high-voltage (HV) power amplification system 100. Such a system can include an HV power amplifier assembly 54 configured to include HV amplification operation of some or all of the PAs (e.g., 60a-60c). As described herein, such PAs can be biased by a bias system 56. In some embodiments, the foregoing HV amplification operation can be facilitated by an HV supply system 58. In some embodiments, an interface system 72 can be implemented to provide interface functionalities between the HV power amplifier assembly 54 and either or both of the bias system 56 and the HV supply system 58.

Described herein are examples related to enhancing power amplifier (PA) efficiency through cascode current steering. It is noted that a Doherty amplifier can provide efficiency advantages over a traditional single ended amplifier. In some embodiments, advanced modulation schemes with high peak to average ratios require or make it desirable for a Doherty amplifier to be operated several dB from the maximum saturated output power ($P_{sat}$) to maintain linearity. Since a Doherty amplifier typically has an efficiency peak about 6 dB from P, its linear efficiency leaves room for improvement.

Disclosed herein are examples of how an efficiency response similar to a Doherty amplifier can be obtained without the complexity of a radio-frequency (RF) input splitter/phase shifter and an output combiner.

Figure 5:
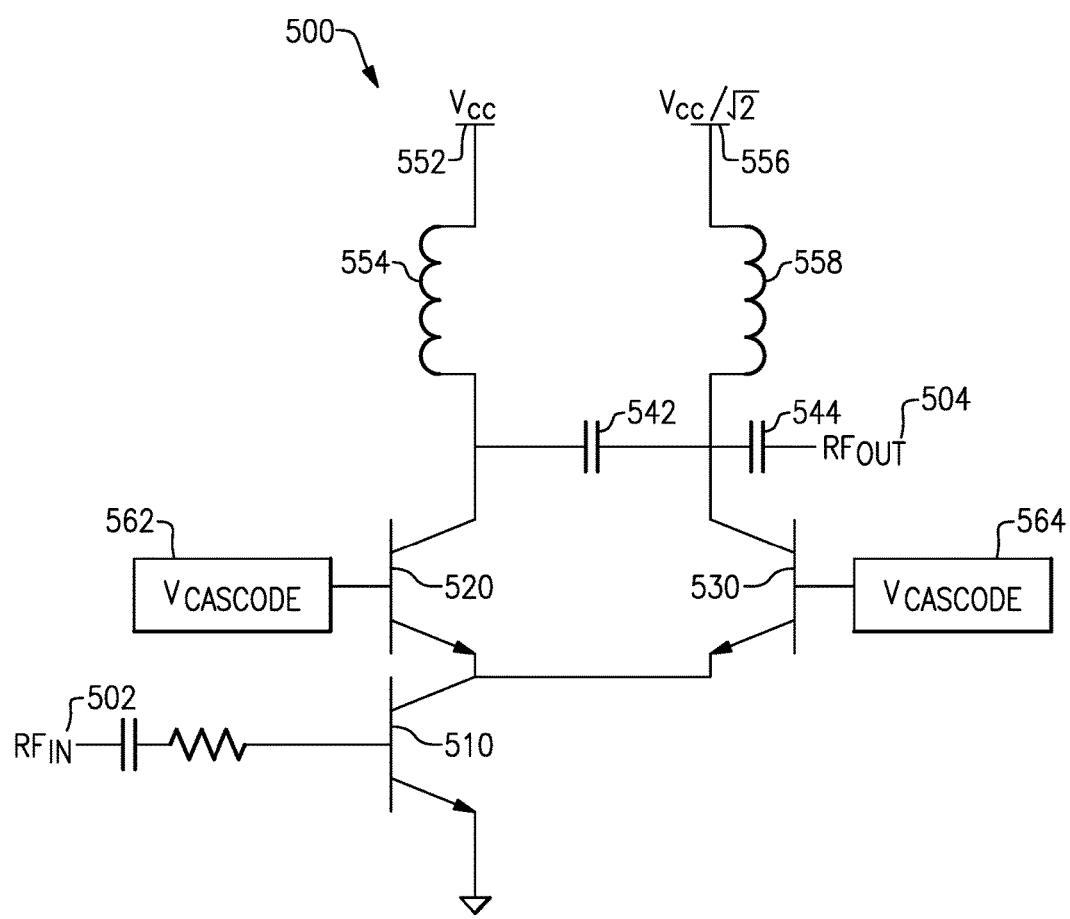
FIG. 5 is a schematic diagram of a current steering cascode amplifier according to some implementations.

FIG. 5 shows an example schematic diagram of a current steering cascode amplifier 500 according to some implementations. As shown in FIG. 5, the current steering cascode amplifier 500 has a common emitter 510 configured to receive an input RF signal ($RF_{in}$ 502) at its base and generate an output through its collector ($RF_{in}$ 504). Such an output is shown to be provided to an emitter of a peaking amplifier 520 and also to an emitter of a carrier amplifier 530. The carrier amplifier 530 is shown to generate its output through its collector, and the peaking amplifier 520 is shown to generate its output through its collector. Accordingly, the common emitter 510 and the carrier amplifier 530 can form a carrier cascode configuration. Similarly, the common emitter 510 and the peaking amplifier 520 can form a peaking cascode configuration.

In the example of FIG. 5 the collector nodes of the carrier amplifier 530 and the peaking amplifier 520 are shown to be coupled by a DC-blocking capacitance element 542. The collector of the carrier amplifier 530 is shown to be coupled to an output node ($RF_{out}$ 504) through a DC-blocking capacitance element 544.

A supply voltage $V_{cc}$ is 552 shown to be provided to the collector of the peaking amplifier 520 through a choke inductance element 554. A supply voltage $V_{cc}/\sqrt{2}$ 556 is shown to be provided to the collector of the carrier amplifier 530 through a choke inductance element 558.

The peaking amplifier 520 is shown to be biased at its base with a peaking cascode bias voltage $V_{cascode}$ 562 from a peaking bias system. The carrier amplifier 530 is shown to be biased at its base with a carrier cascode bias voltage $V_{cascode}$ 564 from a carrier bias system.

Figure 6:
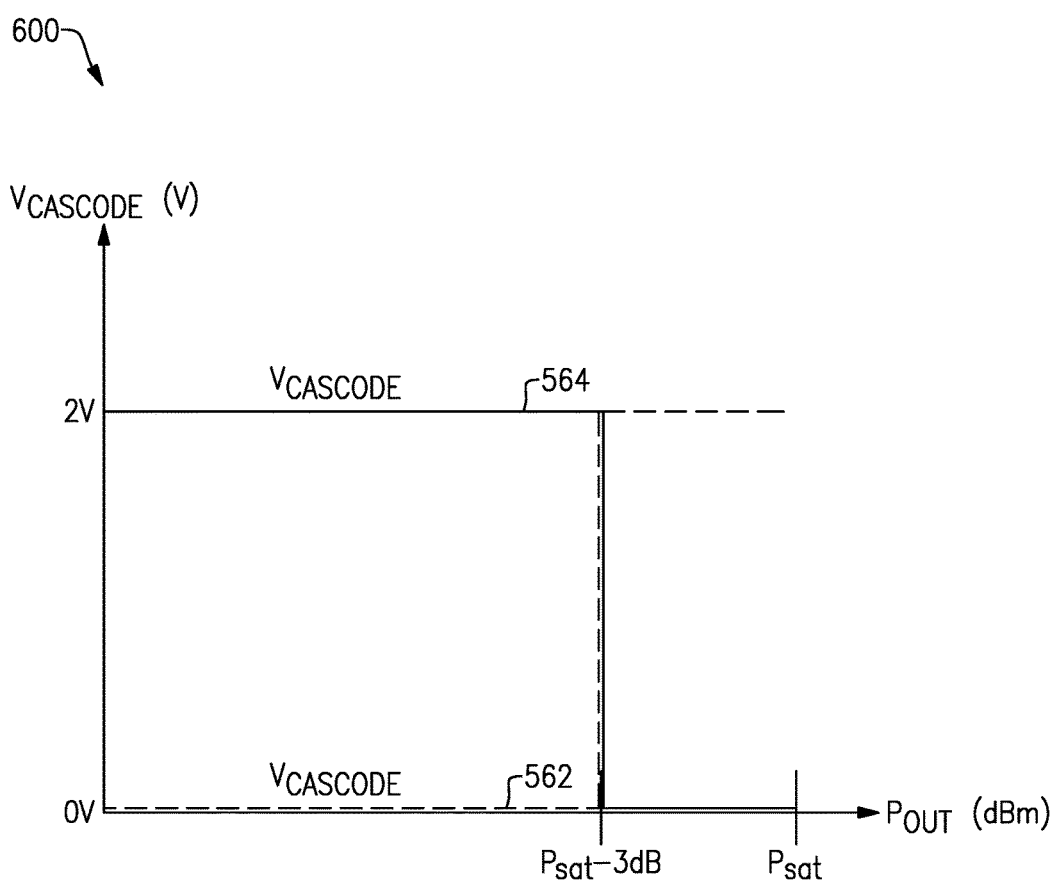
FIG. 6 shows an example plot of cascode bias voltage control according to some implementations.

FIG. 6 shows an example plot 600 of cascode bias voltage control according to some implementations. As shown in FIG. 6, the carrier cascode bias voltage $V_{cascode}$ 564 (solid curve) and the peaking cascode bias voltage $V_{cascode}$ 562 (dashed curve) vary as functions of output power $P_{out}$. For example, the carrier cascode bias voltage $V_{cascode}$ 564 is shown to have a value of approximately 2V when Pout<Psat−3 dB and approximately 0V when Pout>Psat−3 dB. The peaking cascode bias voltage $V_{cascode}$ 562 is shown to have a value of approximately 0V when Pout<Psat−3 dB and approximately 2V when Pout>Psat−3 dB.

Figure 7:
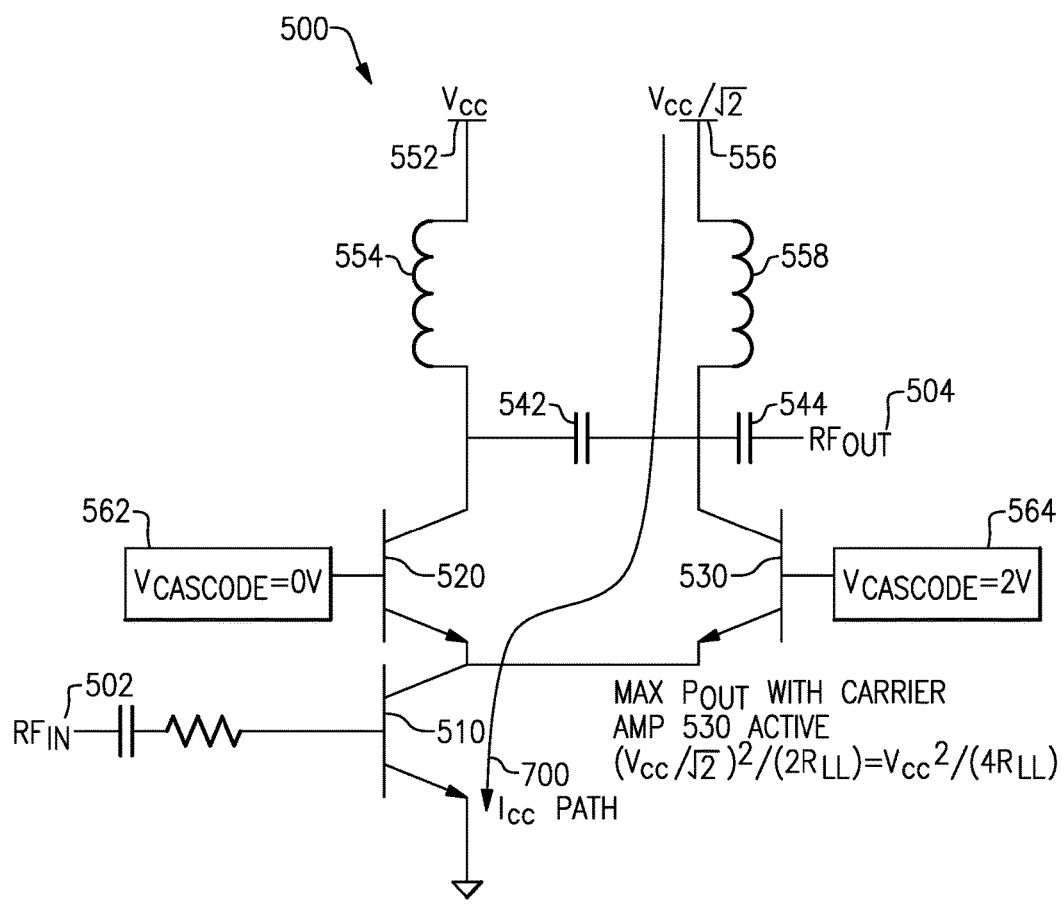
FIG. 7 shows an example current path of the current steering cascode amplifier in FIG. 5 according to some implementations.

With the foregoing biasing configuration, the example current path as shown in FIG. 7 (e.g., $I_{cc}$ path 700) can be obtained when Pout<Psat−3 dB. In such a state where the peaking cascode bias voltage $V_{cascode}$ 562 is 0V (and thus the peaking amplifier 520 is off) and the carrier cascode bias voltage $V_{cascode}$ 564 is 2V (and thus the carrier amplifier 530 is on), a collector current $I_{cc}$ is shown to pass through the cascode arrangement of the carrier amplifier 530 and the common emitter 510 (e.g., the $I_{cc}$ path 700). The maximum $P_{out}$ in such a state is $(V_{cc}/\sqrt{2})^2/(2R_{LL})=V_{cc}^2/(4R_{LL})$, where $R_{LL}$ is load resistance.

Figure 8:
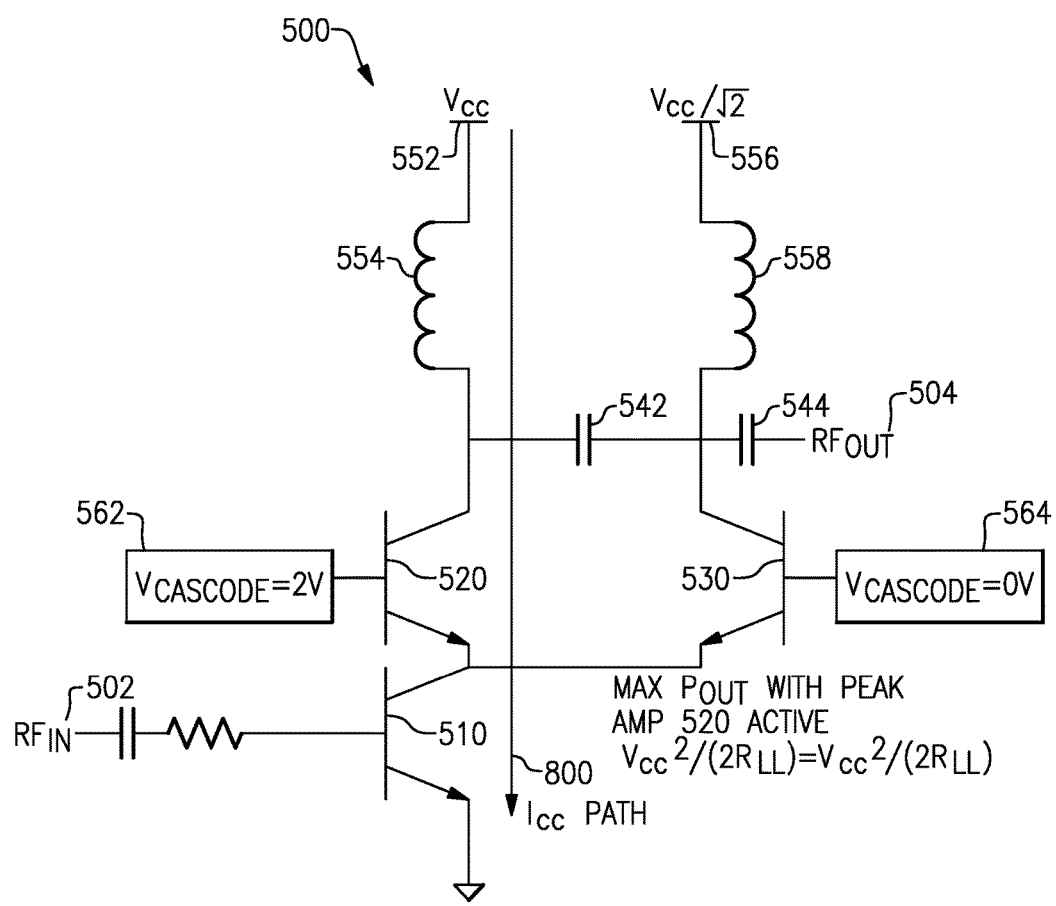
FIG. 8 shows another example current path of the current steering cascode amplifier in FIG. 5 according to some implementations.

Similarly, with the foregoing biasing configuration, the example current path as shown in FIG. 8 (e.g., $I_{cc}$ path 800) can be obtained when Pout>Psat−3 dB. In such a state where the peaking cascode bias voltage $V_{cascode}$ 562 is 2V (and thus the peaking amplifier 520 is on) and the carrier cascode bias voltage $V_{cascode}$ 564 is 0V (and thus the carrier amplifier 530 is off), a collector current $I_{cc}$ is shown to pass through the cascode arrangement of the peaking amplifier 520 and the common emitter 510 (e.g., the $I_{cc}$ path 800). The maximum $P_{out}$ in such a state is $V_{cc}^2/(2R_{LL})=V_{cc}^2/(2R_{LL})$, where $R_{LL}$ is load resistance.

With reference to the examples of FIGS. 6-8, two supply voltages $V_{cc}/\sqrt{2}$ and $V_{cc}$ are provided to the carrier amplifier 530 and the peaking amplifier 520, respectively. In some implementations, the supply voltage $V_{cc}$ 552 for the peaking amplifier 520 can be provided from, for example, a boost DC/DC converter. In some implementations, the supply voltage $V_{cc}/\sqrt{2}$ 556 for the carrier amplifier 530 can be provided from, for example, a buck converter.

Also referring to FIGS. 6-8, in a first region where Pout<Psat−3 dB, the cascode base voltage of the peaking amplifier 520 is pulled to ground, and the cascode base voltage of the carrier amplifier 530 is pulled high (e.g., 2V). Such a configuration forces substantially all of the collector current to be pulled from the supply voltage $V_{cc}/\sqrt{2}$ 556. The maximum output power of the PA in this configuration is $V_{cc}^2/(4R_{LL})$, and maximum efficiency is achieved at this output power.

In a region where Pout>Psat−3 dB, the cascode base voltage of the peaking amplifier 520 is pulled high (e.g., 2V), and the cascode base voltage of the carrier amplifier 530 is pulled to ground. Such a configuration forces substantially all the collector current to be pulled from the supply voltage $V_{cc}$ 552. The maximum output power of the PA in this configuration is $V_{cc}^2/(2R_{LL})$ or 3 dB higher than the carrier amplifier configuration.

It is further noted that the foregoing supply rejection of an amplifier in the cascode configuration preserves the gain of the amplifier in either configuration. Such an effect can minimize or reduce any discontinuities in the amplitude-to-amplitude (AM-AM) response during the transition between the supply voltage $V_{cc}$ 552 and the supply voltage $V_{cc}/\sqrt{2}$ 556.

Figure 9:
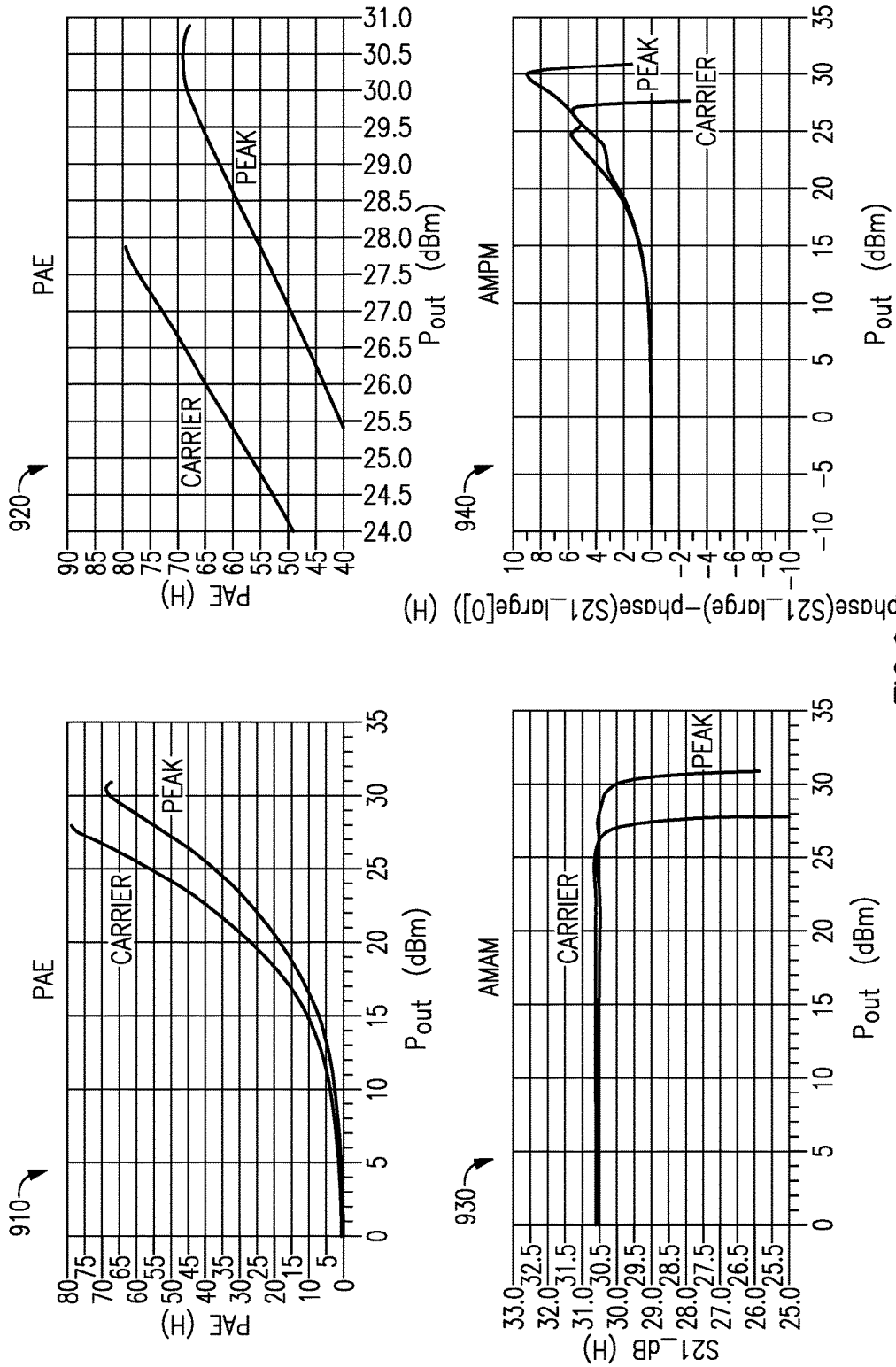
FIG. 9 shows example responses of the carrier and peaking amplifiers according to some implementations according to some implementations.

FIG. 9 shows example responses of the carrier and peaking amplifiers according to some implementations. According to some implementations, the diagram 910 shows an example of power added efficiency (PAE) response for the peaking and carrier amplifiers. According to some implementations, the diagram 920 shows another example of PAE response for the peaking and carrier amplifiers. According to some implementations, the diagram 930 shows an example amplitude-to-amplitude (AM-AM) response for the peaking and carrier amplifiers. According to some implementations, the diagram 940 shows an example of amplitude-to-phase (AM-PM) response for the peaking and carrier amplifiers.

Figure 10:
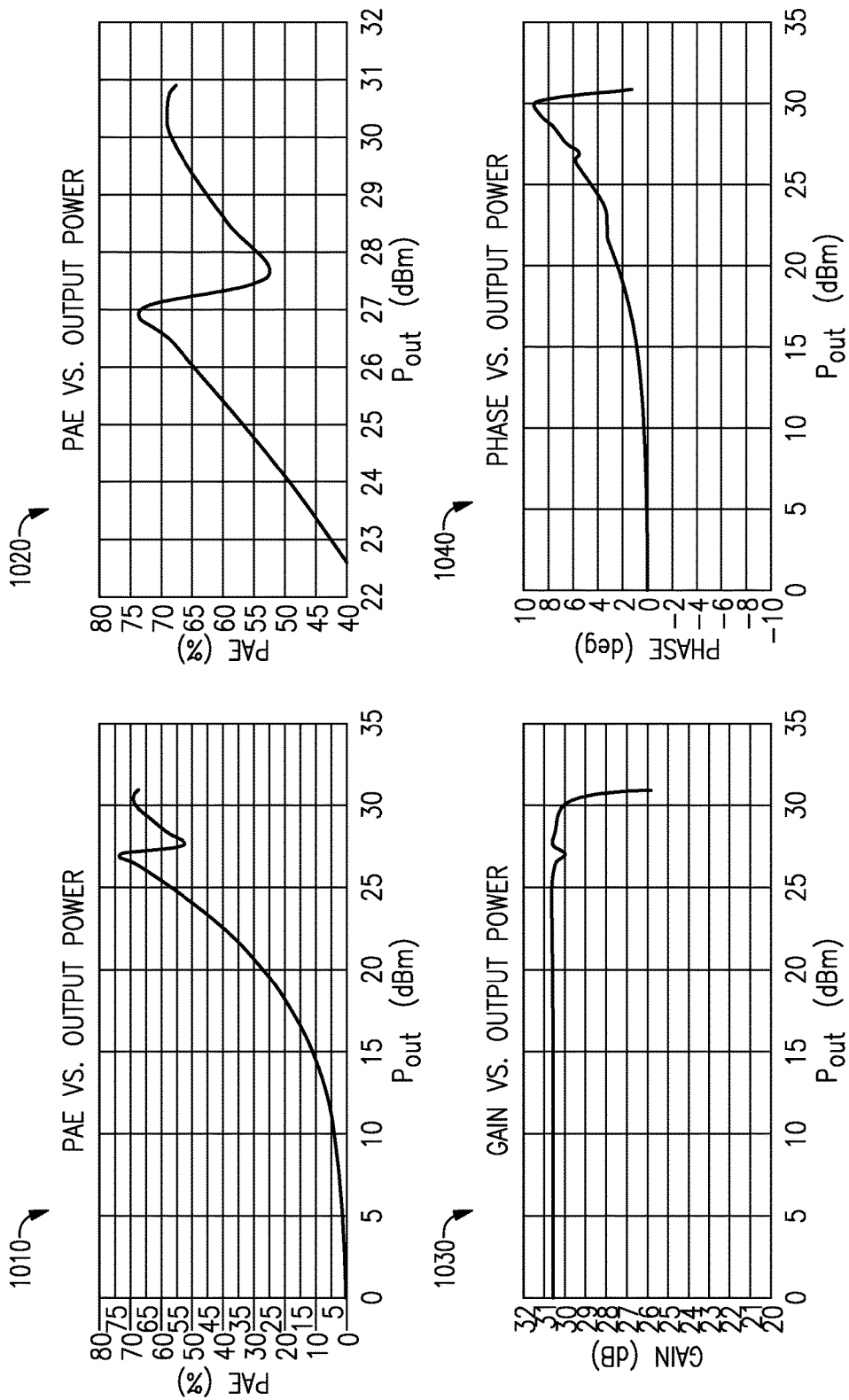
FIG. 10 shows example performance plots of the current steering cascode amplifier according to some implementations.

FIG. 10 shows example performance plots of the current steering cascode amplifier as a whole according to some implementations. According to some implementations, the diagram 1010 shows an example of power added efficiency (PAE) versus output power ($P_{out}$). According to some implementations, the diagram 1020 shows another example of PAE versus output power ($P_{out}$). According to some implementations, the diagram 1030 shows an example of gain versus output power ($P_{out}$). According to some implementations, the diagram 1040 shows an example of phase versus output power ($P_{out}$).

Figure 11:
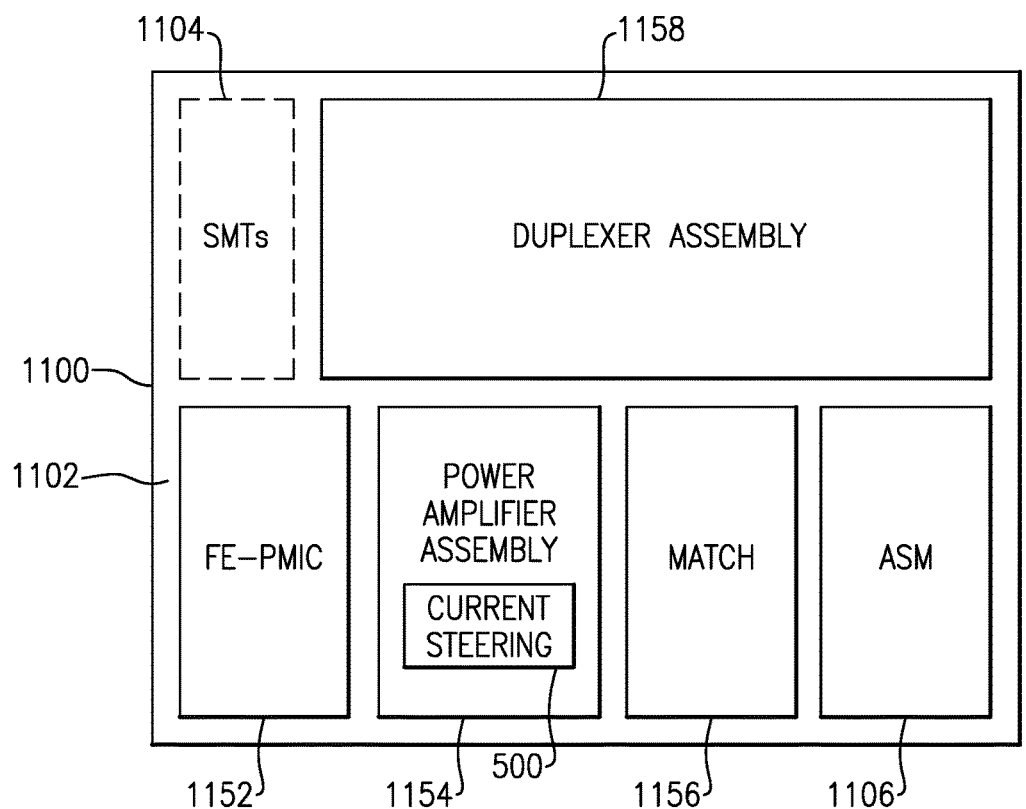
FIG. 11 is a schematic diagram of an example radio-frequency (RF) module according to some implementations.

FIG. 11 shows that in some embodiments, some or all of the current steering cascode amplifier described herein can be implemented in a radio frequency (RF) module. Such a module can be, for example, a front-end module (FEM). In the example of FIG. 11, a module 1100 can include a packaging substrate 1102, and a number of components can be mounted on such a packaging substrate. For example, a front-end power management integrated circuit (FE-PMIC) component 1152, a power amplifier assembly 1154 including the current steering cascode amplifier 500, a match component 1156, and a duplexer assembly 1158 can be mounted and/or implemented on and/or within the packaging substrate 1102. Other such as a number of optional surface mount technology (SMT) devices 1104 and an antenna switch module (ASM) 1106 can also be mounted on the packaging substrate 1102. Although all of the various components are depicted as being laid out on the packaging substrate 1102, it will be understood that some component(s) can be implemented over other component(s).

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 12:
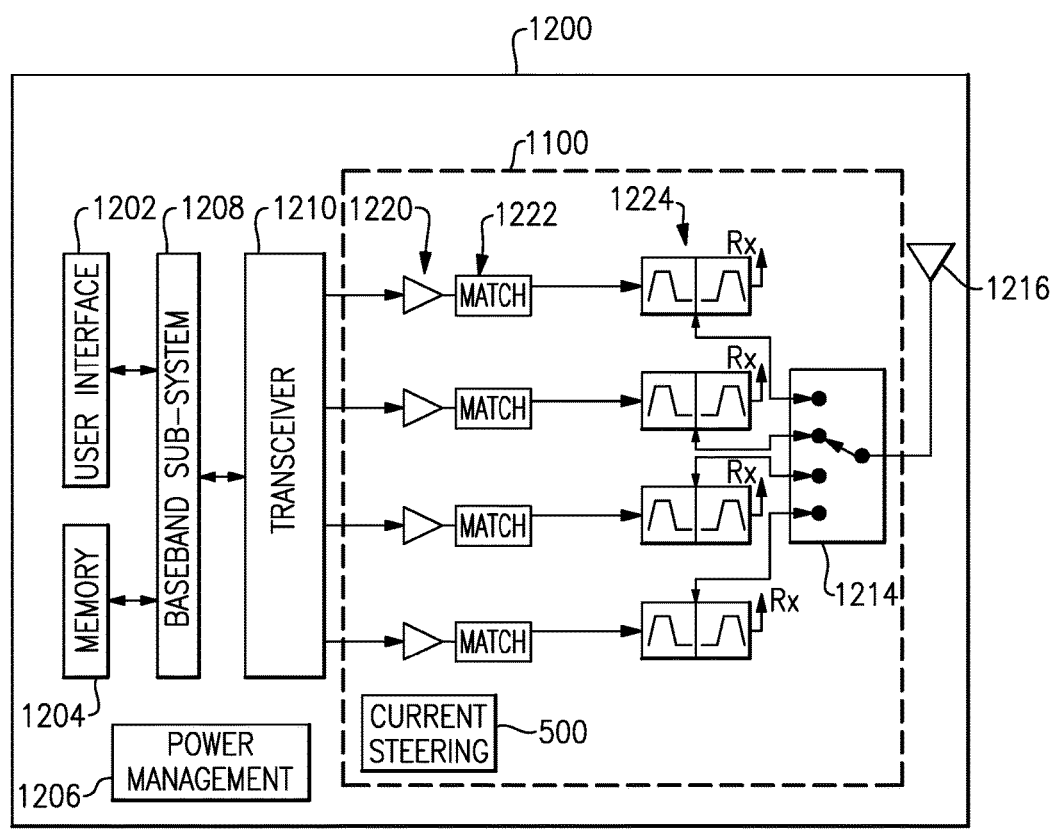
FIG. 12 is a schematic diagram of an example RF device according to some implementations.

FIG. 12 depicts an example radio frequency (RF) device 1200 having one or more advantageous features described herein. According to some implementations, the RF device 1200 is a wireless device. In the context of a module having one or more features as described herein, such a module can be generally depicted by a dashed box 1100, and can be implemented as, for example, a front-end module (FEM). As described herein, such a module can include one or more PAs having a current steering feature. According to some implementation, the current steering feature functions similarly to the current steering cascode amplifier 500 as described herein.

Referring to FIG. 12, power amplifiers (PAs) 1220 can receive their respective RF signals from a transceiver 1210 that can be configured and operated in known manners to generate RF signals to be amplified and transmitted, and to process received signals. The transceiver 1210 is shown to interact with a baseband sub-system 1208 that is configured to provide conversion between data and/or voice signals suitable for a user and RF signals suitable for the transceiver 1210. The transceiver 1210 can also be in communication with a power management component 1206 that is configured to manage power for the operation of the RF device 1200. Such power management can also control operations of the baseband sub-system 1208 and the module 1100.

The baseband sub-system 1208 is shown to be connected to a user interface 1202 to facilitate various input and output of voice and/or data provided to and received from the user. The baseband sub-system 1208 can also be connected to a memory 1204 that is configured to store data and/or instructions to facilitate the operation of the wireless device, and/or to provide storage of information for the user.

In the example shown in FIG. 12, the outputs of the PAs 1220 are shown to be matched (via respective match circuits 1222) and routed to their respective duplexers 1224. Such amplified and filtered signals can be routed to an antenna 1216 through an antenna switch 1214 for transmission. In some embodiments, the duplexers 1224 can allow transmit and receive operations to be performed simultaneously using a common antenna (e.g., 1216). In FIG. 12, received signals are shown to be routed to "Rx" paths (not shown) that can include, for example, one or more low-noise amplifiers (LNAs).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier (PA) comprising:
a common emitter configured to receive a radio-frequency (RF) signal;
a carrier amplifier coupled to the common emitter to form a carrier cascode configuration, a collector of the carrier amplifier provided with a first supply voltage; and
a peaking amplifier coupled to the common emitter to form a peaking cascode configuration, a collector of the peaking amplifier provided with a second supply voltage greater than the first supply voltage, substantially all of a collector current of the power amplifier obtained from either the first supply voltage or the second supply voltage based on a selected value of an output power of the power amplifier.

2. The power amplifier of claim 1 wherein each of the carrier and peaking amplifiers is provided with a bias voltage to allow the respective amplifier to be turned on and off.

3. The power amplifier of claim 2 wherein the carrier amplifier is turned on by having its bias voltage set to a high level and the peaking amplifier is turned off by having its bias voltage set to a ground level, when the output power (Pout) of the power amplifier is less than the selected value.

4. The power amplifier of claim 3 wherein substantially all of the collector current of the power amplifier is obtained from the first supply voltage to yield a maximum or increased efficiency at the output power.

5. The power amplifier of claim 3 wherein the carrier amplifier is turned off by having its bias voltage set to the ground level and the peaking amplifier is turned on by having its bias voltage set to the high level, when Pout is greater than the selected value.

6. The power amplifier of claim 5 wherein substantially all of the collector current of the power amplifier is obtained from the second supply voltage to yield an increase in maximum output power.

7. The power amplifier of claim 5 wherein the selected value is saturation power level (Psat) minus 3 dB.

8. The power amplifier of claim 2 wherein the carrier cascode configuration and the peaking cascode configuration substantially preserve a gain of the power amplifier in either configuration.

9. The power amplifier of claim 2 wherein the power amplifier has minimized or reduced discontinuity in an amplitude-to-amplitude (AM-AM) response during a transition between the first and second supply voltages.

10. A radio-frequency (RF) module comprising:
a packaging substrate configured to receive a plurality of components; and
a power amplifier (PA) implemented on the packaging substrate, the power amplifier including a common emitter configured to receive a radio-frequency signal, the power amplifier further including a carrier amplifier coupled to the common emitter to form a carrier cascode configuration, a collector of the carrier amplifier provided with a first supply voltage, the power amplifier further including a peaking amplifier coupled to the common emitter to form a peaking cascode configuration, a collector of the peaking amplifier provided with a second supply voltage greater than the first supply voltage, substantially all of a collector current of the power amplifier obtained from either the first supply voltage or the second supply voltage based on a selected value of an output power of the power amplifier.

11. The radio-frequency module of claim 10 wherein the radio-frequency module is a front-end module (FEM).

12. The radio-frequency module of claim 10 wherein each of the carrier and peaking amplifiers is provided with a bias voltage to allow the respective amplifier to be turned on and off.

13. The radio-frequency module of claim 12 wherein the carrier amplifier is turned on by having its bias voltage set to a high level and the peaking amplifier is turned off by having its bias voltage set to a ground level, when the output power (Pout) of the power amplifier is less than the selected value.

14. The radio-frequency module of claim 13 wherein substantially all of the collector current of the power amplifier is obtained from the first supply voltage to yield a maximum or increased efficiency at the output power.

15. The radio-frequency module of claim 13 wherein the carrier amplifier is turned off by having its bias voltage set to the ground level and the peaking amplifier is turned on by having its bias voltage set to the high level, when Pout is greater than the selected value.

16. The radio-frequency module of claim 15 wherein substantially all of the collector current of the power amplifier is obtained from the second supply voltage to yield an increase in maximum output power.

17. The radio-frequency module of claim 12 wherein the carrier cascode configuration and the peaking cascode configuration substantially preserve a gain of the power amplifier in either configuration.

18. A radio-frequency (RF) device comprising:
a transceiver configured to generate a radio-frequency signal;
a front-end module (FEM) in communication with the transceiver, the front-end module including a packaging substrate configured to receive a plurality of components, the front-end module further including a power amplifier (PA) implemented on the packaging substrate, the power amplifier including a common emitter configured to receive an radio-frequency signal, the power amplifier further including a carrier amplifier coupled to the common emitter to form a carrier cascode configuration, a collector of the carrier amplifier provided with a first supply voltage, the power amplifier further including a peaking amplifier coupled to the common emitter to form a peaking cascode configuration, a collector of the peaking amplifier provided with a second supply voltage greater than the first supply voltage, substantially all of a collector current of the power amplifier obtained from either the first supply voltage or the second supply voltage based on a selected value of an output power of the power amplifier; and an antenna in communication with the front-end module, the antenna configured to transmit an amplified radio-frequency signal.

19. The radio-frequency device of claim 18 wherein the radio-frequency device includes a wireless device.

20. The radio-frequency device of claim 19 wherein the wireless device includes at least one of a base station, a repeater, a cellular phone, a smartphone, a computer, a laptop, a tablet computer, and a peripheral device.

* * * * *